United States Patent [19]

Biet

[11] Patent Number: 5,144,321
[45] Date of Patent: Sep. 1, 1992

[54] METHOD DEVICE AND MICROWAVE ANTENNA SYSTEM FOR APPLYING DISCRETE DELAYS TO A SIGNAL

[75] Inventor: Michel Biet, Massy, France

[73] Assignee: Alcatel N.V., Amsterdam, Netherlands

[21] Appl. No.: 670,345

[22] Filed: Mar. 14, 1991

[30] Foreign Application Priority Data

Mar. 16, 1990 [FR] France ............................ 90 03397

[51] Int. Cl.$^5$ .................................. H01Q 3/26
[52] U.S. Cl. .................................. 342/375; 359/140
[58] Field of Search .................. 359/140, 238, 256; 342/375, 373

[56] References Cited

U.S. PATENT DOCUMENTS

| | | | |
|---|---|---|---|
| 3,495,892 | 2/1970 | Dailey | 350/381 |
| 4,028,702 | 6/1977 | Levine | 342/375 |
| 4,094,581 | 1/1977 | Baldwin et al. | 350/150 |
| 4,671,604 | 6/1987 | Soref | 350/96.15 |
| 4,686,533 | 8/1987 | MacDonald et al. | 342/373 |
| 4,725,844 | 2/1988 | Goodwin et al. | 342/375 X |
| 4,769,853 | 9/1988 | Goodwin et al. | 455/616 |

OTHER PUBLICATIONS

B. M. Hendrickson, "Optoelectronic Signal Processiing For Phased-Array Antennas", Proceedings SPIE, vol. 886, Sessions 7 and 8, pp. 213-255 (1988).
M. Kondo et al., "High-Speed Optical Time Switch With Integrated Optical 1×4 Switches ... ", Proceedings IOOC'83, pp. 437-439 (1983).
R. A. Soref, "Programmable time-delay devices", Applied Optics, vol. 23, No. 21, 1 Nov. 1984, pp. 3736-3737.
S. Thaniyavarn, "Wavelength independent, optical damage immune ... ", Appl. Physics Lett., vol. 47 (7), 1 Oct. 1985, pp. 674-677.
J. Noda et al., "Polarization-Maintaining Fibers ... ", Journal of Lightwave Tech., vol. LT-4, No. 8, Aug. 1986, pp. 1071-1089.
Ady Arie, et al., "Polarization Controlled Fiber Optic Recirculating Delay Line Filter and its Associated Phase Induced Intensity Noise" Optical Fiber Sensors, New Orleans, 1988.
Richard Soref, "Programmable time-delay devices", Applied Optics, New York, 1989.
H. W. Yen, "Optical Technology for Microwave Applications", IEEE, 1986, Microwave and Millimeter-Wave, Monolithic Circuits Symposium.

*Primary Examiner*—Mark Hellner
*Attorney, Agent, or Firm*—Christie, Parker & Hale

[57] ABSTRACT

A digitally controlled delay is applied to a microwave signal by applying the signal to a transmitter to modulate an optical wave which is transmitted by polarization holding optical fibers after its polarization is switched in TE or TM mode in switching units. An optical receiver reconstitutes a delayed microwave signal. Variation of the delay is controlled by delay select signals controlling the switching units. The principle finds particular application in phased array antenna systems.

6 Claims, 2 Drawing Sheets

METHOD DEVICE AND MICROWAVE ANTENNA SYSTEM FOR APPLYING DISCRETE DELAYS TO A SIGNAL

BACKGROUND OF THE INVENTION

Field of the invention

The present invention concerns the application of discrete delays to a signal, in particular to a microwave electrical signal possibly modulated by a signal conveying information. It applies in particular to a phased array antenna system.

A known device for applying discrete delays comprises:

an optical emitter the intensity of which can be modulated and which is adapted to receive a signal to be delayed constituting an input signal and to supply an optical carrier wave modulated by said input signal, an optical delay line in the form of an optical fiber adapted to receive said wave and to guide it and apply a delay to it, a receiver adapted to receive said wave at the output of said optical delay line and to supply an output signal representative of the modulation it carries, and means for controlling the delay applied to said wave.

The result is usually referred to as a "variable delay line". The need for opto-electronic devices of this kind in microwave applications has often been pointed out, including in various prior art documents listed at the end of this description, in particular the first of those documents.

The propagation time of the carrier wave in a line of this kind can be varied in discrete steps by switching between fibers of different lengths.

Electro-optical switches are used for changing the optical delay line under electrical control. If a single switching stage is used, the number of optical delay lines of the device is equal to the number of different delays required (see document 2). This number is reduced if a number of switching stages are connected in series (see document 3). It remains large if the number of delays is large, however.

One object of the present invention is to reduce the number of optical delay lines needed to apply a given number of different delays to an electrical signal.

SUMMARY OF THE INVENTION

In one aspect, the present invention comprises in a method of applying discrete delays to a signal by converting said signal into the form of a guided optical wave to which a selective delay is applied and controlling the polarization direction of said optical wave before injecting it into a birefringent polarization holding guide which applies said delay to it.

In another aspect, the present invention comprises in a device for applying discrete delays to a signal comprising at least one delay switching stage comprising:

a delay unit adapted to receive an optical wave conveying an input signal to be delayed and to apply to said wave a stage delay having selectively either a high value or a low value, and a switching unit adapted to receive a delay select signal appropriate to said stage and to be responsive thereto by controlling the delay applied by said delay unit so that said optical wave after passing through said switching stage conveys a stage output signal having said stage delay relative to said input signal, in which device said delay unit incorporates a signal optical delay line in the form of a polarization holding optical fiber having two principal transverse directions constituting a slow direction and a fast direction so that two optical waves at the same frequency polarized in said slow and fast directions propagate in said fiber with respective relatively low and relatively high velocities, and said switching unit comprising at least one polarization switch at the input of said optical delay line and controlled by said delay select signal to polarize said optical wave in said slow direction or said fast direction of said fiber and thereby to assign to said stage delay either said high value or said low value, respectively.

In a further aspect, the present invention consists in a phased array antenna system comprising:

an array of antenna elements adapted to transmit or to receive microwave radio waves and respectively to receive or to supply respective microwave electrical signals corresponding thereto, a central circuit adapted to transmit or to receive said microwave electrical signals to or from respective antenna elements, and a respective composite line for each antenna element adapted to transmit a microwave electrical signal between said antenna element and said central circuit, each composite line comprising a delay device adapted to apply a selective delay to the electrical signal carried thereby, in which antenna system each delay device is a device for applying discrete delays to a signal comprising at least one delay switching stage comprising:

a delay unit adapted to receive an optical wave conveying an input signal to be delayed and to apply to said wave a stage delay having selectively either a high value or a low value, and a switching unit adapted to receive a delay select signal appropriate to said stage and to be responsive thereto by controlling the delay applied by said delay unit so that said optical wave after passing through said switching stage conveys a stage output signal having said stage delay relative to said input signal, in which device said delay unit incorporates a signal optical delay line in the form of a polarization holding optical fiber having two principal transverse directions constituting a slow direction and a fast direction so that two optical waves at the same frequency polarized in said slow and fast directions propagate in said fiber with respective relatively low and relatively high velocities, and said switching unit comprising at least one polarization switch at the input of said optical delay line and controlled by said delay select signal to polarize said optical wave in said slow direction or said fast direction of said fiber and thereby to assign to said stage delay either said high value or said low value, respectively.

The present invention will now be described by way of non-limiting example only with reference to the accompanying diagrammatic drawings.

DETAILED DESCRIPTION OF THE INVENTION

Figure 1:
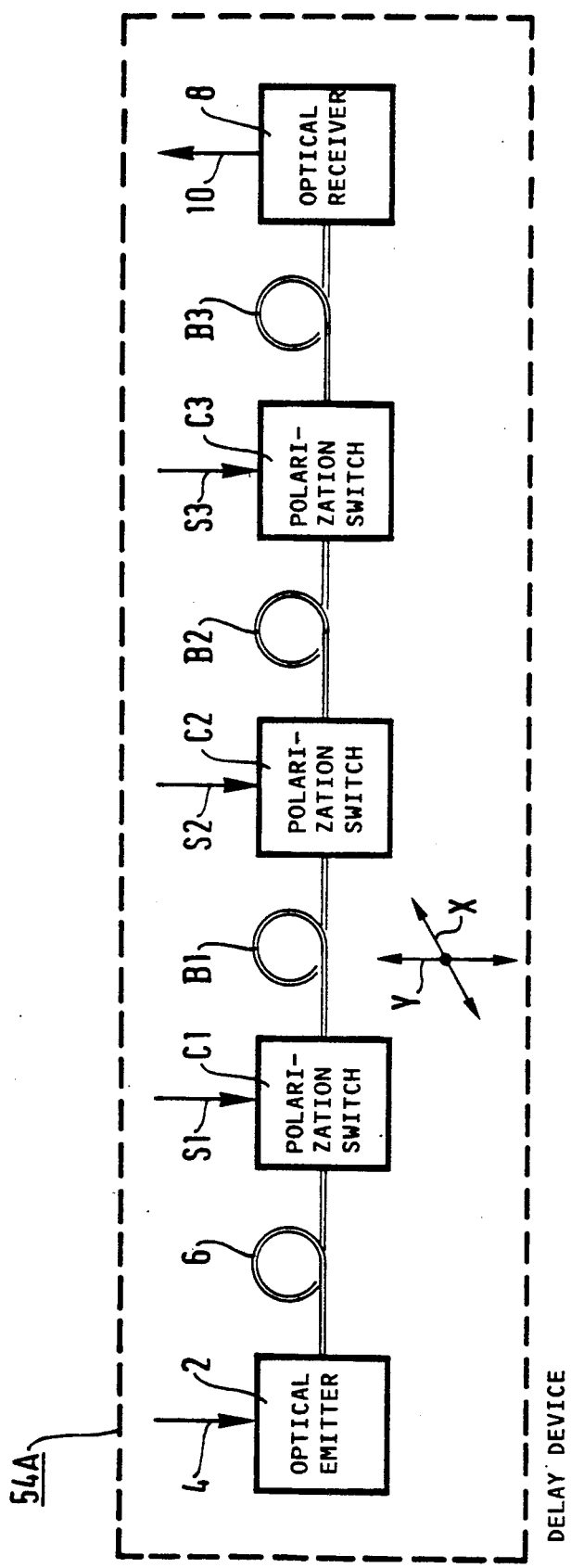
FIG. 1 is a block diagram of a delay device in accordance with the present invention.

A general description will now be given of the various preferred arrangements for implementing one embodiment of the invention used in the device described by way of example. Some of these arrangements are common to this device and to a prior art device described in documents 2 and 3, whereas others are specific to the invention.

The delay device comprises an optical emitter 2 receiving an input signal 4 to be delayed, for example a microwave electrical or electromagnetic signal. The emitter outputs an optical wave amplitude modulated by the input signal. The modulation may be performed in a separate modulator associated with a laser. The delay device further comprises at least one switching stage comprising:

a delay unit adapted to receive said optical wave and to apply to it a delay having either of two different values, and a switching unit adapted to receive a delay select signal S1 for this stage and to control the delay applied by the delay unit.

The device further comprises an optical receiver 8 adapted to receive the optical wave that has passed through at least this switching stage and to supply an output signal 10 having at least said delay relative to the input signal.

In a typical application of the present invention the input and output signals are of the same kind, specifically microwave radio signals.

By virtue of a feature specific to the present invention, the delay unit comprises a single optical delay line B1 in the form of a polarization holding optical fiber. An optical fiber of this kind has two principal transverse directions, namely a slow direction X and a fast direction Y whereby two optical waves at the same frequency polarized in the slow and fast directions propagate in the fiber with substantially different velocities, one relatively low and the other relatively high, constituting respective slow and fast waves. The slow wave therefore acquires an additional delay relative to the fast wave. The switching unit comprises at least one polarization switch C1 at the input of the optical delay line B1 and controlled by the delay select signal S1 so as to polarize said optical wave in the slow direction or the fast direction of the fiber. Said additional delay therefore constitutes a selective delay which it applied or not according to the delay select signal.

By virtue of a feature common to the invention and to the prior art, the device comprises a succession of switching stages C1 - B1, C2 - B2, C3 - B3 connected in series to apply to said optical wave a succession of stage delays. Each of the latter comprises a minimal stage delay and a selective stage delay which is present or not according to the state of said delay select signal. The selective stage delays form a geometrical series with the ratio $\frac{1}{2}$: $R_1$, $R_2 = \frac{1}{2} R_1$, $R_3 = \frac{1}{4} R_1$. The resulting device is a digitally controlled delay device.

By virtue of a feature specific to the invention, said optical delay lines B1, B2, B3 of said switching stages are identical except for their lengths which are proportional to said selective stage delays and consequently form a geometrical series defining the geometrical series of delays: $L_1$, $L_2 = \frac{1}{2} L_1$, $L_3 = \frac{1}{4} L_1$.

In the example shown the delay device comprises first, second and third switching stages comprising respective switching units C1, C2 and C3 controlled by delay select signals S1, S2 and S3 and optical delay lines B1, B2 and B3 with lengths $L_1$, $L_2$ and $L_3$ adapted to apply selective delays $R_1$, $R_2$ and $R_3$.

The number of stages may be increased, a stage of rank n comprising an optical delay line of length $L_n = (\frac{1}{2})^{n-1} L_1$ adapted to apply a selective delay $R_n = (\frac{1}{2})^{n-1} R_1$.

Referring to the figure, the device described by way of example further comprises, in addition to the items previously mentioned, an optical fiber for connecting the optical emitter 2 to the switching stages B1 - C1, etc remote from the transmitter. This fiber is also of the polarization holding type.

The switching units C1, etc are integrated optical devices. They receive an optical wave that has been linearly polarized by the emitter 2 but which could instead be polarized downstream of the emitter. They are in the form of TE-TM polarization converters, of the kind described in document 4, for example. They could instead receive an optical wave comprising two components, one with TE polarization and the other with TM polarization, being controlled to select one or the other of these components to be injected into the optical delay line B1, etc.

The optical delay lines are chosen to feature high birefringence, with a refractive index difference of approximately 1 μm. In that regard, the below cited document 5 is a useful reference on this subject matter.

For example, an optical delay line with a refractive index difference of $5 \times 10^{-4}$ and a length of 60 m can introduce selectively a delay equivalent to 3 cm of propagation in vacuum.

The present invention also concerns a phased array antenna system.

The theory of such systems has been known for a long time (see document 1). Transmit antennas of this kind comprise an array of radiating sources constituting antenna elements and supplied with microwave energy through phase-shifters. If the phase is varied in a linear manner along the array a plane wave is formed. Its orientation depends on the phase shifts. The greatest phase shift required depends on the size of the array and can vary from one to several wavelengths.

For many reasons, and in particular for reasons of weight and overall size, waveguides and coaxial cables may be replaced with optical links to distribute the microwave signals within the system (see document 1). The phase shifting may be applied in the optical or in the microwave domain. Optical techniques potentially allow a saving in weight and greater delays independent of the microwave frequency, which is advantageous in broadband systems.

In a receive phased array antenna it is the observation direction which is selected by the choice of phase shifts.

According to the present invention such phase shifts, whether for transmission or for reception, can be obtained by means of the selective delays applied by the delay devices previously described and which then constitute said phase shifters.

Figure 2:
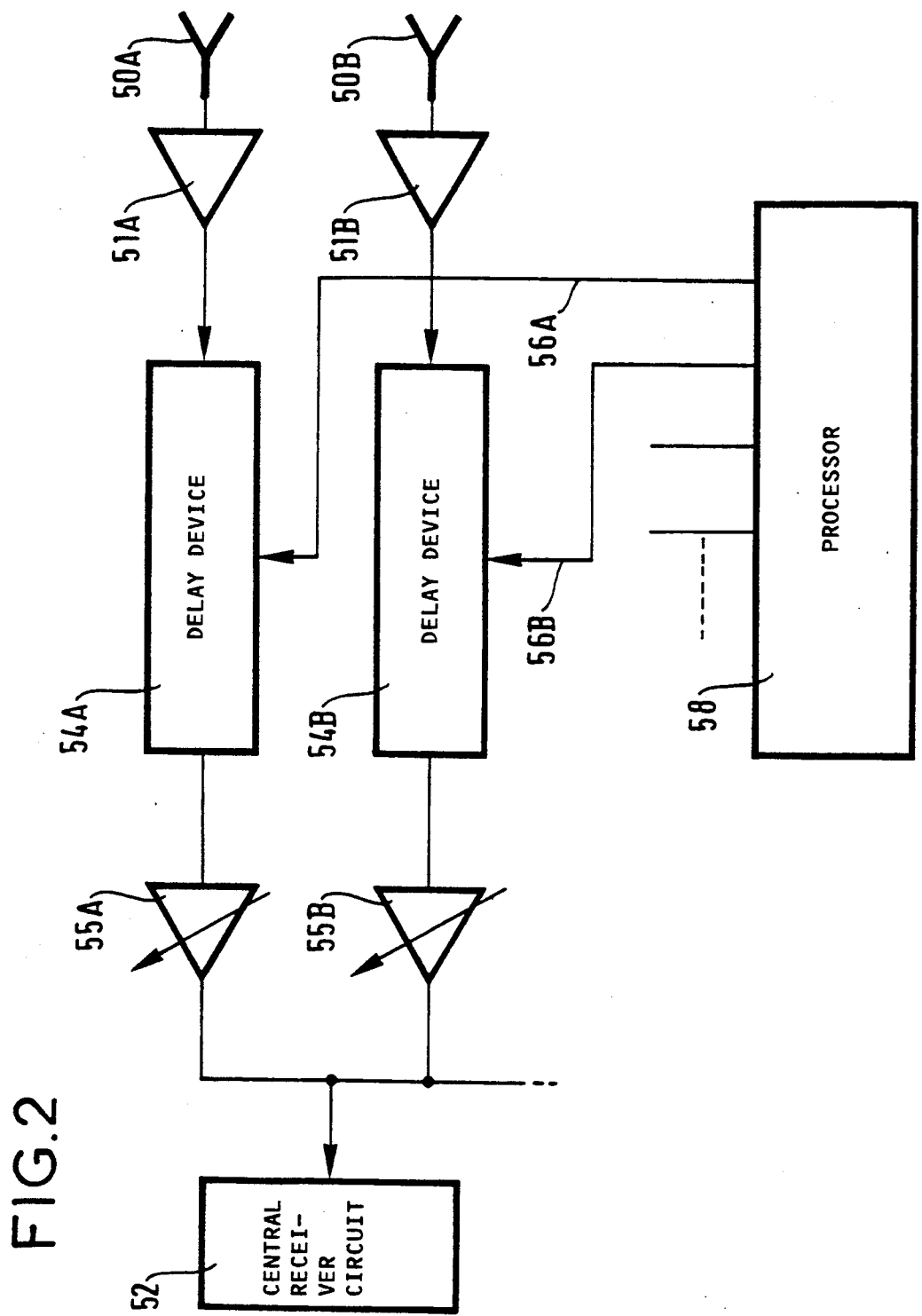
FIG. 2 is a block diagram of a phased array antenna system in accordance with the invention.

An array antenna system in accordance with the invention may comprise the following units which are known for the stated function:

an array of antenna elements 50A, 50B, etc adapted to transmit or receive microwave radio waves and respectively to receive or supply microwave electrical signals corresponding to said waves; the antennas 50A, 50B, etc in FIG. 2 are receive antennas;

a central circuit respectively adapted to send to or receive from said antenna elements said microwave electrical signals, for example the central receiver circuit 52; and a respective composite line for each of said antenna elements adapted to transmit a microwave electrical signal with a selective delay between said antenna element and said central circuit, the composite lines shown by way of example in FIG. 2 belonging to a receive antenna system. Referring to FIG. 2, a first antenna element 50A applies an input signal via a microwave amplifier 51A to a delay device 54A which supplies a microwave output signal delayed relative to the input signal.

The output signal is amplified by a variable gain amplifier 55A and applied to the central circuit 52.

The combination of units 51A, 54A and 55A constitutes a first composite line.

A second antenna element and its respective second composite line comprise analogous devices designated by the same reference number with the suffix B rather than A.

Further antenna elements and composite lines are not shown in the figure.

The delays applied by the devices 54A, 54B, etc are controlled by digital control signals 56A, 56B, etc supplied by a processor 58 according to the required observation direction and each comprising a plurality of binary digits. These signals are the delay select signals S1, S2, S3, etc.

If the frequency of said electrical signals is 10 GHz, for example, a delay device 54A, etc can constitute a three-bit binary digital phase-shifter with the three bits provided by the signals S1, S2 and S3. To this end it comprises three optical delay lines B1, B2 and B3 having a refractive index difference of $5 \times 10^{-4}$ and respective lengths of 30 m, 15 m and 7.5 m.

The potentially wide bandwidth of polarization switches that can be used in the delay devices of this antenna system makes it possible to switch the transmit (or receive) direction very quickly towards a plurality of targets (or transmitters). It also enables mean direction control by a method analogous to that used in optics for phase adaptation reflectors.

The documents referred to above are as follows:
1/ Proceedings SPIE, vol 886, sessions 7 and 8, pp. 213-255 (1988).
2/ M. Kondo, K. Komatsu, Y. Ohta, S. Suzuki, K. Nagashima, and H. Goto: Proceedings IOOC'83, p. 437-439 (1983).
3/ R.A. Soref, Applied Optics 23, pp 3736-37 (1984).
4/ S. Thaniyavarn, Appl.Phys. Letters 47, pp 674-14 677 (1985).
5/ J. Noda, K. Okamoto and Y. Sasaki: J. Light Technology, LT4, pp 1071-1089 (1986).

There is claimed:

1. Device for applying discrete delays to a signal, said device comprising at least one delay switching stage, each said switching stage comprising: a delay unit adapted to receive an optical wave conveying an input signal to be delayed and to apply to said wave a stage delay having selectively either a high value or a low value, and a switching unit adapted to receive a delay select signal appropriate to said stage and to be responsive thereto by controlling the delay applied by said delay unit so that said optical wave after passing through said switching stage conveys a stage output signal having said stage delay relative to said input signal, wherein said delay unit incorporates a single optical delay line in the form of a polarization holding optical fiber having two principal transverse directions constituting a slow direction and a fast direction so that two optical waves at the same frequency polarized in said slow and fast directions propagate in said fiber with respective relatively low and relatively high velocities, and said switching unit comprises at least one polarization switch at the input of said optical delay line and controlled by said delay select signal to polarize said optical wave in said slow direction or said fast direction of said fiber and thereby to assign to said stage delay either said high value or said low value, respectively.

2. Device according to claim 1 comprising a succession of said switching stages connected in series to apply to said optical wave a corresponding succession of said stage delays each of which can include a selective stage delay which is equal to the difference between said high and low values and which is present or absent according to the state of said delay select signal, said selective stage delays forming a geometrical series in ratio ½ so as to provide a digitally controlled delay device in which said optical delay lines of said switching stages are identical except for their respective lengths, which are proportional to said selective stage delays and therefore form a corresponding geometrical series in ratio ½.

3. Device according to claim 1 wherein an optical emitter receives said input signal in a non-optical form and outputs said optical signal in response to said input signal and an optical receiver receives said optical wave after it has passed through at least said delay switching stage and supplies an output signal of the device in a non-optical form.

4. Phased array antenna system comprising:
an array of antenna elements adapted to transmit to or receive microwave radio waves and respectively to receive or to supply respective microwave electrical signals corresponding thereto, a central circuit adapted to transmit or to receive said microwave electrical signals to or from respective antenna elements, and, a respective composite line for each antenna element adapted to transmit a microwave electrical signal between said antenna element and said central circuit, each composite line comprising a delay device adapted to apply a selective delay to the electrical signal carried thereby, wherein each said delay device applies discrete delays to a signal and comprises at least one delay switching stage, each said switching stage comprising:

a delay unit adapted to receive an optical wave conveying an input signal to be delayed and to apply to said wave a stage delay having selectively either a high value or a low value, and a switching unit adapted to receive a delay select signal appropriate to said stage and to be responsive thereto by controlling the delay applied by said delay unit so that said optical wave after passing through said switching stage conveys a stage output signal having said stage delay relative to said input signal, wherein said delay unit incorporates a single optical delay line in the form of a polarization holding optical fiber having two principal transverse directions constituting a slow direction and a fast direction so that two optical waves at the same frequency polarized in said slow and fast directions propagate in said fiber with respective relatively low and relatively high velocities, and said switching unit comprises at least one polarization switch at the input of said optical delay line and controlled by said delay select signal to polarize said optical wave in said slow direction or said fast direction of said fiber and thereby to assign to said stage delay either said high value or said low value, respectively.

5. Device according to claim 4 comprising a succession of said switching stages connected in series to apply to said optical wave a corresponding succession of said stage delays each of which can include a selective stage delay which is equal to the difference between said high and low values and which is present or absent according to the state of said delay select signal, said selective stage delays forming a geometrical series in ratio ½ so as to provide a digitally controlled delay device in which said optical delay lines of said switching stages are identical except for their respective lengths, which are proportional to said selective stage delays and therefore form a corresponding geometrical series in ratio ½.

6. Device according to claim 4 wherein an optical emitter receives said input signal in a non-optical form and outputs said optical signal in response to said input signal and an optical receiver receives said optical wave after it has passed through at least said delay switching stage and supplies an output signal of the device in a non-optical form.

* * * * *